United States Patent
Chen et al.

(10) Patent No.: US 11,860,226 B2
(45) Date of Patent: Jan. 2, 2024

(54) TIME OFFSET METHOD AND DEVICE FOR TEST SIGNAL

(71) Applicant: CHANGXIN MEMORY TECHNOLOGIES, INC., Hefei (CN)

(72) Inventors: Liang Chen, Hefei (CN); Xuemeng Lan, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 170 days.

(21) Appl. No.: 17/657,427

(22) Filed: Mar. 31, 2022

(65) Prior Publication Data

US 2023/0003796 A1   Jan. 5, 2023

(30) Foreign Application Priority Data

Jul. 2, 2021  (CN) .......................... 202110753138.9

(51) Int. Cl.
  *G01R 31/08* (2020.01)
  *G01R 31/317* (2006.01)
  *G01R 31/319* (2006.01)

(52) U.S. Cl.
  CPC . *G01R 31/31727* (2013.01); *G01R 31/31723* (2013.01); *G01R 31/31726* (2013.01); *G01R 31/31905* (2013.01)

(58) Field of Classification Search
  CPC ........ G01R 31/31723; G01R 31/31727; G01R 31/31726; G01R 31/31905; G01R 31/31922
  See application file for complete search history.

(56) References Cited

U.S. PATENT DOCUMENTS

| | | | |
|---|---|---|---|
| 9,201,092 B2 * | 12/2015 | Behrens ........... | G01R 31/31924 |
| 2003/0076125 A1 * | 4/2003 | McCord ............... | G11C 29/006 |
| | | | 324/754.07 |
| 2006/0111861 A1 * | 5/2006 | Horne ............... | G01R 31/31937 |
| | | | 702/89 |
| 2006/0241885 A1 * | 10/2006 | Ikeda ............... | G01R 31/31922 |
| | | | 702/108 |

FOREIGN PATENT DOCUMENTS

CN    108614206 B    8/2020

* cited by examiner

*Primary Examiner* — Thang X Le
(74) *Attorney, Agent, or Firm* — Cooper Legal Group, LLC

(57) ABSTRACT

Embodiments of the present application provide a time offset method and device for a test signal. When a signal source sends a test signal to a DUT on a test platform, the offset device can determine a time delay caused by impedance matching of the test signal to the DUT at the upper side of each test location, and conduct time offset for TCK signals sent by the signal source to different DUTs according to the time delay.

18 Claims, 7 Drawing Sheets

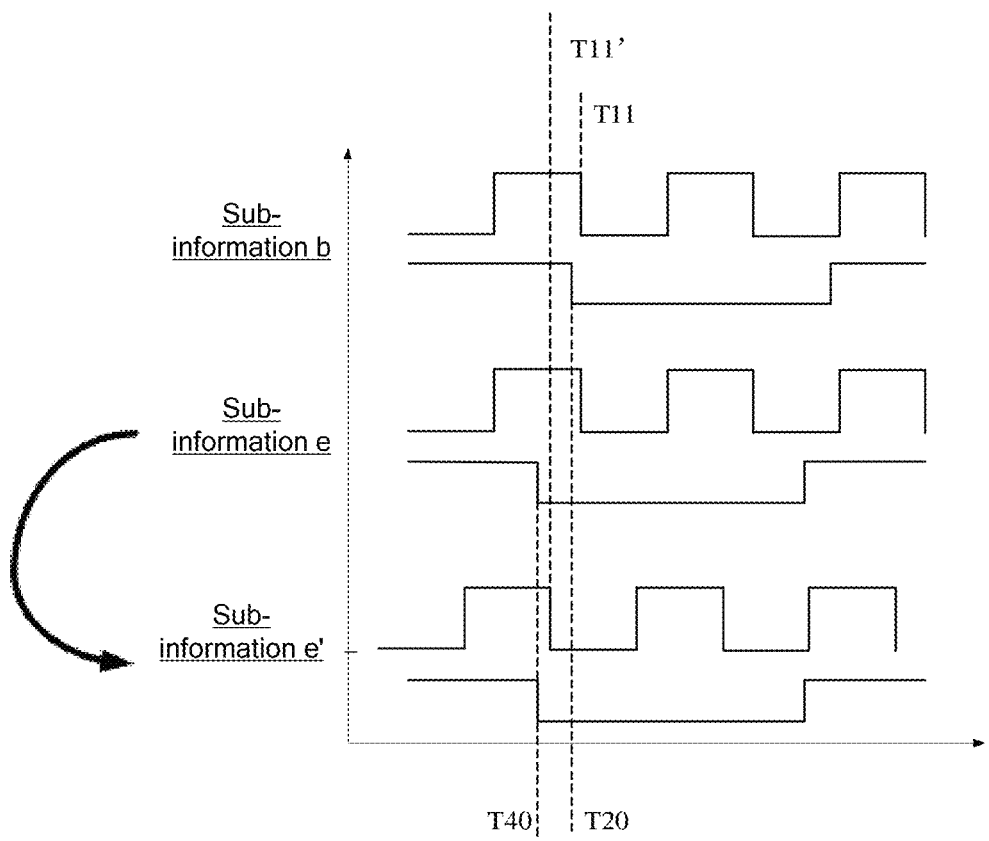
FIG. 12
```
TPD_OFFSET
    PIN         LINE1
    F8          0                : Ind-OUT1
                     392
    F802        362              : Ind-OUT2
                     784
    F803        724              : Ind-OUT3
                     1176
    F804        1086             : Ind-OUT4
```
FIG. 13
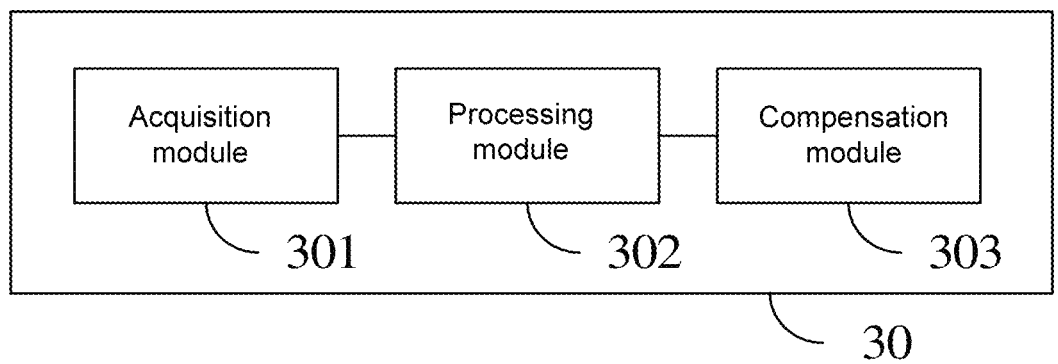
FIG. 14

TIME OFFSET METHOD AND DEVICE FOR TEST SIGNAL

CROSS-REFERENCE TO RELATED APPLICATION

This application claims the priority of Chinese Patent Application No. 202110753138.9, submitted to the Chinese Intellectual Property Office on Jul. 2, 2021, the disclosure of which is incorporated herein in its entirety by reference.

TECHNICAL FIELD

The present application relates to the technical field of testing, and in particular to a time offset method and device for a test signal.

BACKGROUND

With the continuous development of electronic techniques, more and more electronic components, chips and integrated circuits have been widely used to provide diversified functions and capabilities in various fields. In view of this, producers of such devices, in response to the all-the-more advanced level of integration, are supposed to consistently secure the performance of the devices. For this purpose, it is necessary to test the devices for their performance before delivery. For example, a test signal is inputted to a device under test (DUT) to detect whether the DUT meets the preset conditions according to the output of the test signal, thus testing the performance of the DUT.

In the prior art, a common method to improve the detection efficiency for a same kind of device is to simultaneously dispose a plurality of the devices on a daisy chain test platform. After a signal source inputs a test signal to the test platform, all the devices disposed on the test platform can receive the same test signal and process it. In this way, batch inspection of the devices can be achieved by detecting whether the devices can accurately receive such signal.

However, the test signal experiences a transmission time delay caused by the impedance matching of a transmission line and other devices on a transmission path from a signal source to the corresponding device, such that the test signal cannot be received accurately by the device, which in turns affects the test accuracy of the device.

SUMMARY

According to a first aspect, the present application provides a time offset method for a test signal, including: acquiring time parameters of each of DUTs when a signal source sends a test signal to the DUTs at a plurality of test locations on a test platform, where impedance on a transmission path between the signal source and each of the test locations differs from one another, and the time parameters are used for indicating whether the impedance on each transmission path has an impact on receiving the test signal by the DUT; determining, based on target time parameters and the time parameters of each of the DUTs, offset parameters corresponding to the plurality of test locations where the DUTs are located; and sending the signal source the plurality of offset parameters corresponding to the plurality of test locations such that the signal source performs, according to the plurality of offset parameters, time offset for test clock (TCK) signals sent to the plurality of test locations.

According to a second aspect, the present application provides a time offset device for test signals, including: one or more processors; and a storage apparatus, configured to store one or more programs, wherein the one or more programs, when executed by the one or more processors, cause the one or more processors to execute operations of: acquiring time parameters of each of DUTs when a signal source sends a test signal to the DUTs at a plurality of test locations on a test platform, where impedance on a transmission path between the signal source and each of the test locations differs from one another, and the time parameters are used for indicating whether the impedance on each transmission path has an impact on receiving the test signal by the DUT; determining, based on target time parameters and the time parameters of each of the DUTs, offset parameters corresponding to the plurality of test locations where the DUTs are located; and sending the signal source the plurality of offset parameters corresponding to the plurality of test locations such that the signal source performs, according to the plurality of offset parameters, time offset for TCK signals sent to the plurality of test locations.

BRIEF DESCRIPTION OF THE DRAWINGS

To describe the technical solutions in the embodiments of the present application or in the prior art more clearly, the following briefly describes the accompanying drawings required for describing the embodiments or the prior art. Apparently, the accompanying drawings in the following description show some embodiments of the present application, and a person of ordinary skill in the art may still derive other drawings from these accompanying drawings without creative efforts.

FIG. 12 is a schematic diagram illustrating offset for time parameters according to the present application;

FIG. 13 is a schematic diagram illustrating a time offset approach according to the present application;

FIG. 14 is a schematic structural diagram of an offset device for test signals according to an embodiment of the present application.

DETAILED DESCRIPTION

The technical solutions in embodiments of the present application are described below clearly and completely with reference to the drawings in the embodiments of the present application. Apparently, the described embodiments are merely part rather than all of the embodiments of the present application. All other embodiments obtained by those of ordinary skill in the art based on the embodiments of the present application without creative efforts should fall within the protection scope of the present application.

The terms "first", "second", "third", "fourth", and so on (if any) in the specification, claims and the accompanying drawings of the present application are intended to distinguish between similar objects but do not necessarily indicate a specific order or sequence. It should be understood that the data used in such a way may be exchanged under proper conditions to make it possible to implement the described embodiments of the present application in other sequences apart from those illustrated or described here. Moreover, the terms "include", "contain", and any other variants mean to cover the non-exclusive inclusion, for example, a process, method, system, product, or device that includes a list of steps or units is not necessarily limited to those steps or units which are clearly listed, but may include other steps or units which are not expressly listed or inherent to such a process, method, system, product, or device.

Prior to the formal introduction to embodiments of the present application, the application scenario of the present application as well as the problems in the prior art are first explained with reference to the accompanying drawings.

Figure 1:
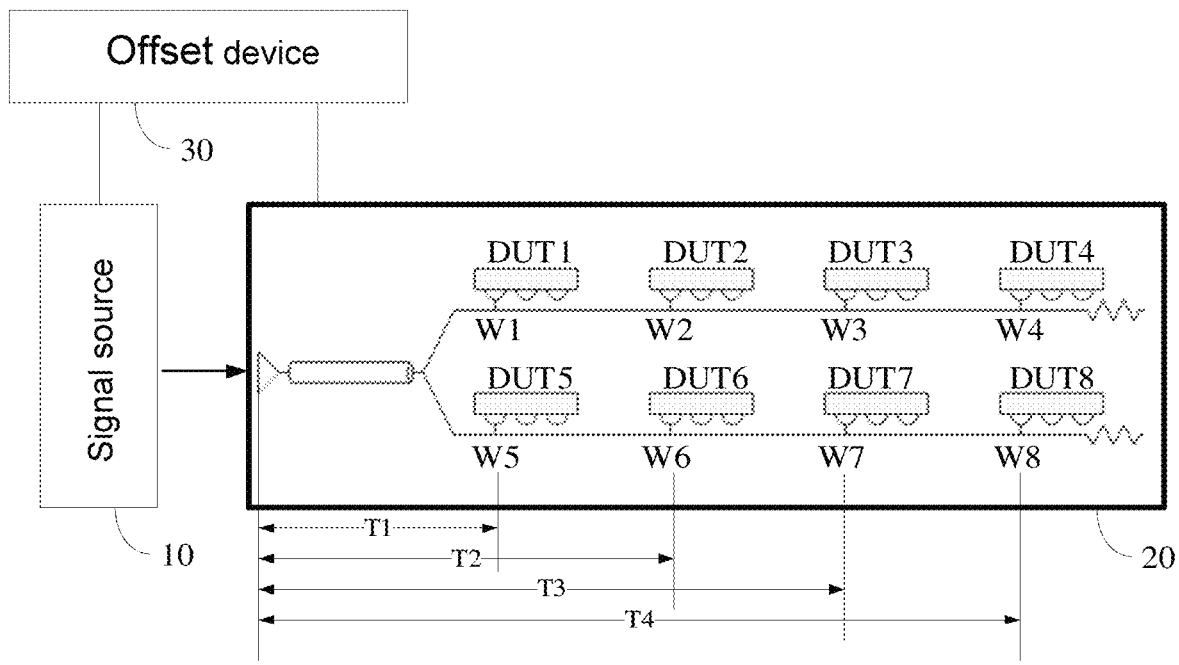
FIG. 1 is a schematic diagram of the application scenario of the present application.

FIG. 1 is a schematic diagram of the application scenario of the present application. In order to detect electronic components, chips, integrated circuits, and other devices, in some technologies, a plurality of devices under test (DUTs for short) can be placed at a plurality of test locations of a daisy chain test platform 20 at the same time. For example, DUT1-DUT8 plotted as examples in FIG. 1 are placed at test locations W1-W8 provided by the test platform 20, respectively. Afterwards, the signal source 10 inputs the test signal via a test signal input interface W0 on the test platform 20, and given that the plurality of test locations on the test platform 20 are all connected to the interface W0, the DUT disposed at each test location can receive the same test signal. At this time, the batch detection of devices can be realized by detecting whether the plurality of DUTs receive test signals, allowing for a higher detection efficiency.

Further, a plurality of test locations can be set on the test platform, and the distance between each of the test location and the signal source varies, such that when the signal source 10 sends a test signal to the test platform 20 at time T0 in an example as shown in FIG. 1, a certain delay exists between the time when the test signal is actually received by the DUT disposed at each test location and time T0. This time delay indicates the time loss caused by the transmission of the test signal across the transmission path on the test platform 20. The farther the test location on the test platform 20 is from the signal source 10, the greater the time delay of the test signal received by the DUT. For example, DUT1 and DUT5 disposed on at test locations W1 and W5 closest to the signal source 10 will receive the test signal at time T1 after T0; and similarly, the DUT4 and DUT8 disposed on at test locations W4 and W8, which are farthest from the signal source 10, will not receive the test signal until time T4 after T0.

In some embodiments, since each test location on the test platform is fixed, after the time delays T1-T4 generated when the test signal is received at each of test locations are determined, time offset can be conducted via the offset device 30 regarding such time delay caused by the transmission distance. For example, in the example shown in FIG. 1, the offset device 30 may be connected to the signal source 10 and the test platform 20, and can control the DUT disposed at each test location on the test platform 20. The offset device 30 may be a computer, a server or chip or other electronic device capable of performing related data processing and control functions. Once the time delays T1-T4 generated at each test location on the test platform 20 are determined, the offset device 30 can control each DUT on the test platform 20. When the signal source 10 sends a test signal at time T0, the offset device 30 controls the DUT1 disposed at the test location W1 to receive the test signal at time T1, and the DUT2 disposed at the test location W2 to receive the test signal at time T2, and so on.

Figure 2:
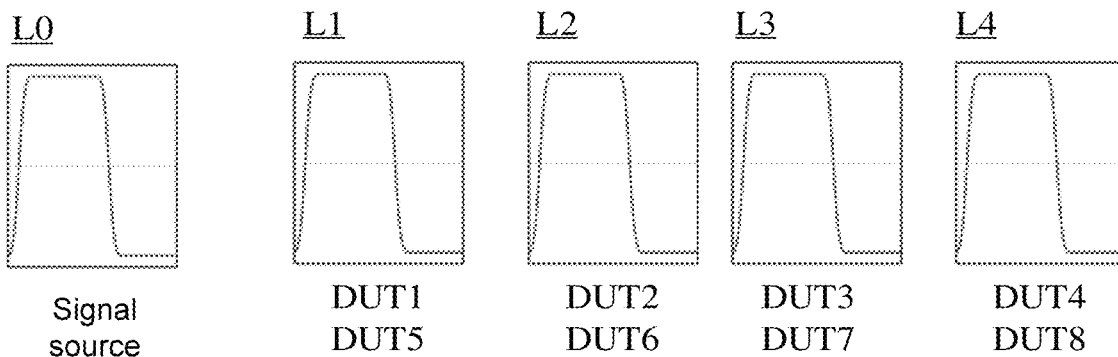
FIG. 2 is a schematic diagram of test signals received by DUTs at different test locations on the test platform according to one embodiment.

In some embodiments, FIG. 2 is a schematic diagram of the test signal received by the DUTs at different test locations on the test platform according to an embodiment. Upon time offset by the offset device 30, when the signal source sends out the test signal L0 at time T0, all DUTs on the test platform 20 can accurately receive the test signals L1-L4 with the same waveform as L0, thus ensuring the smooth completion of the subsequent test.

However, in actual tests, even if time offset is performed for a DUT on the test platform 20 by the offset device 30, some cases in which the DUT cannot accurately receive the test signal may still occur occasionally. Observation shows that, on the transmission path of the test signal from the signal source 10 to the corresponding DUT on the test platform 20, in addition to the time loss caused by the transmission path, there still exists a time delay caused by the impedance matching of DUTs on the test platform 20. The impedance matching of the DUT at each test location varies, where the time delay is caused by the impedance matching between impedance of the DUT at the test location and impedance on the signal transmission line at the test location (1) and/or between impedance of the DUT at the test location and impedance of another DUT at other test locations (2), which will lead to a certain time delay in the transmission of the test signal. As a result, the DUT cannot receive the test signal accurately even at the time offset by the offset device 30, which affects the accuracy of the test platform for testing DUTs and other devices.

Figure 3:
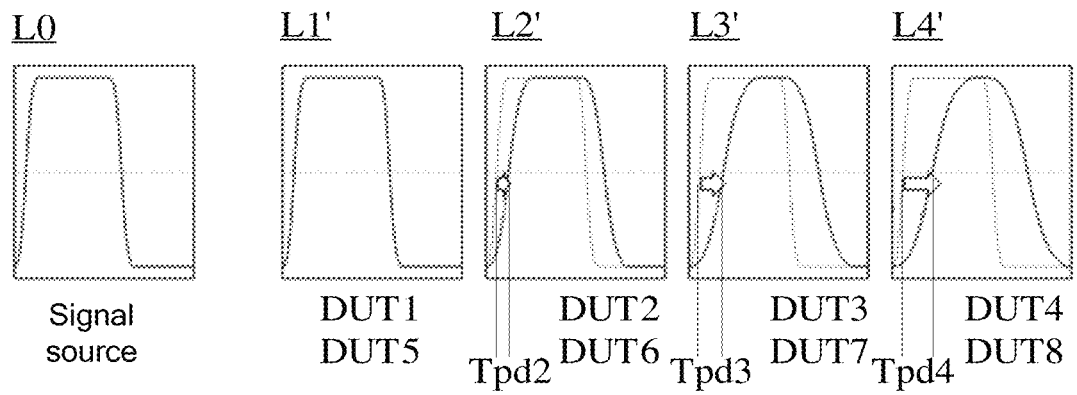
FIG. 3 is a schematic diagram of test signals received by DUTs at different test locations on the test platform according to another embodiment.

For example, FIG. 3 is a schematic diagram of the test signal received by the DUTs at different test locations on the test platform according to another embodiment. When the signal source sends the test signal L0 at time T0, even after the time offset carried out by the offset device 30, a certain time delay (Propagation Delay, referred to as Tpd2) still exists in waveform L2' received by the DUT2 and DUT6 at the test locations W2 and W6, as compared with ideal waveform L2 shown in FIG. 2. Similarly, the waveforms received by the DUT3 and DUT7 at the test locations W3 and W7 have a time delay Tpd3, and the waveforms received by DUT4 and DUT8 at the test locations W4 and W8 have a time delay Tpd4. Moreover, given that the impedance at each test location varies, and the impedance on the transmission path between the signal source and each test location is different, the impedance matching at each test location varies, resulting in different time delay caused by impedance matching at each test location. At the same time, the impedance at the test locations with different distances from the signal source varies on the transmission path, and the impedance at the test locations with the same distance from the signal source is regarded as the same. Consequently, the time delay caused by the matching impedance of the test locations with the same distance from the signal source is the same. Finally, as shown in FIG. 3, the time delay caused by the impedance matching between the impedance of the DUT itself and the impedance on the propagation path and the impedance of the DUT at other locations will stop the DUT from accurately receiving the test signal, which in turn affects the subsequent test results against the DUT.

Therefore, the present application provides a time offset method and device for a test signal, which can implement time offset for the time delay caused by the impedance matching in each DUT on the test platform, so as to overcome the technical problem of time delay caused by the impedance matching to the test signal, which in turn improves the accuracy of the test platform for testing DUTs and other devices. The technical solution of the present application will be described in detail below with reference to specific embodiments. The following specific embodiments may be combined with each other, and the same or similar concepts or processes may not be repeatedly described in some examples.

Figure 4:
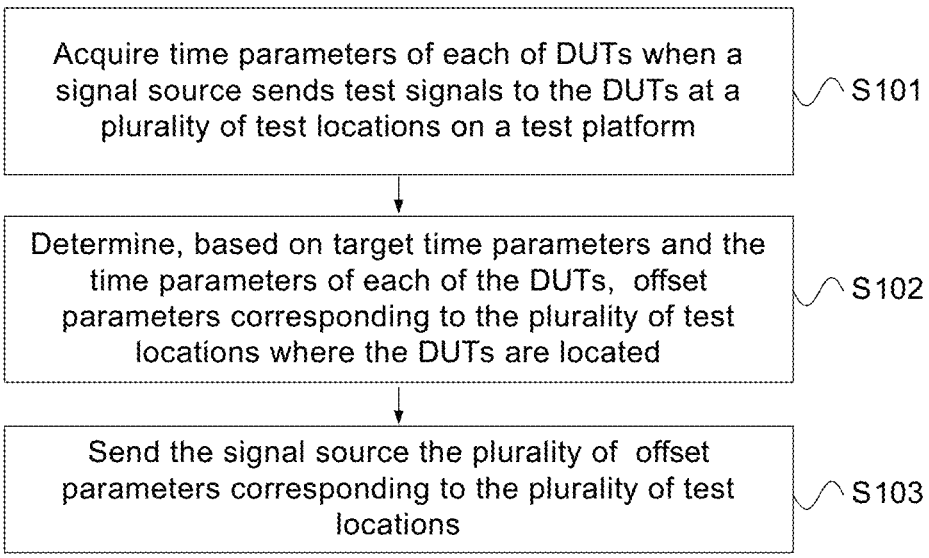
FIG. 4 is a flowchart of a time offset method for a test signal according to an embodiment of the present application.

FIG. 4 is a flowchart of a time offset method for a test signal according to an embodiment of the present application. The method shown in FIG. 4 may be applied to the scenario shown in FIG. 1, and is implemented by the offset device 30, where the method includes:

S101: When the offset device 30 sends the test signal from the signal source 10 to the DUTs at a plurality of test locations on the test platform 20, the offset device 30 acquires the time parameters of each DUT.

Specifically, when offsetting the impedance on a transmission path of test signals, the offset device 30 first needs to determine the time delay Tpd caused by impedance matching at each test location. In order to obtain an accurate time delay Tpd caused by impedance matching at each test location, and to reduce the influence of differences between different chips at different test locations on the detection results of time delay Tpd, methods adoptable in some embodiments of the present application are to place the same DUT at different locations on the test platform, and then collect the time delay Tpd caused by the corresponding impedance matching at different locations at the time when the DUT receives test signals at the different test locations.

Figure 5:
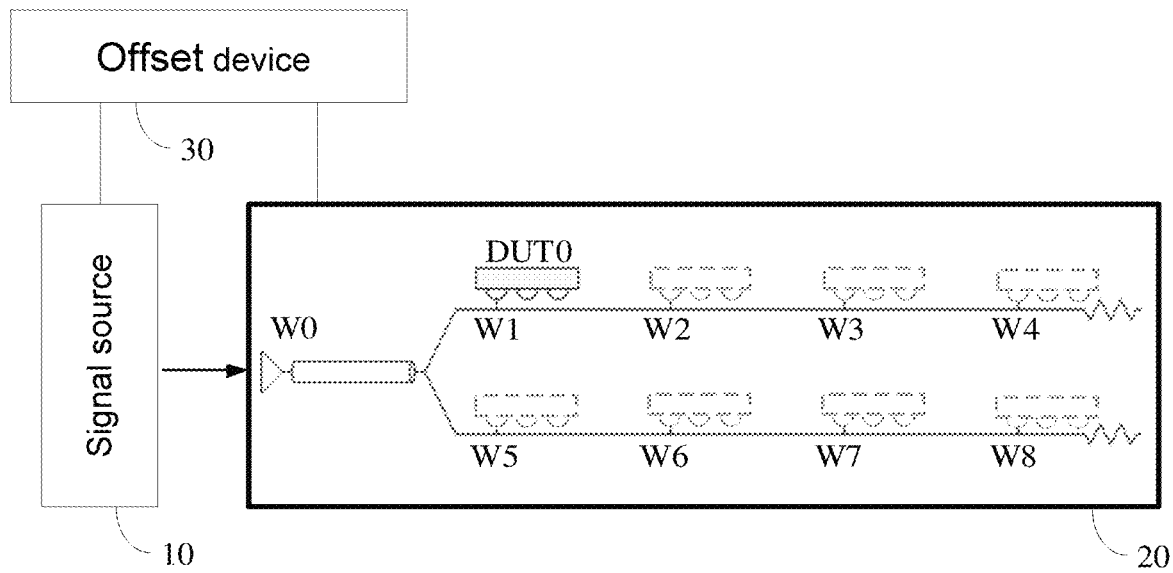
FIG. 5 is a schematic diagram of a test state according to the present application.

For example, FIG. 5 is a schematic diagram of a test state according to the present application. As shown in this figure, a DUT0 is selected and sequentially placed at each of test locations W1-W8 on the test platform 20, and then the time parameters of the DUT0 at each test location are collected.

In some embodiments, the location of the DUT0 may be adjusted by using the offset device 30 to control a slide rail, a mechanical arm, etc., to place the DUT0 at different test locations according to the test requirements, and then the time parameters can be obtained. Alternatively, an operator can manually place the DUT0 at different test locations, and once the offset device 30 determines the location of the DUT0, the time parameters of the DUT0 at that location can be acquired.

In some embodiments, in consideration of the effect of impedance matching caused by the impedance of DUTs at other test locations, when a DUT0 is placed at one test location, e.g., at the test location W1 in FIG. 5, DUTs can also be set at other test locations W2-W8, thereby ensuring the symmetry and stability of signals on the test platform, and obtaining the time parameters in a way closer to the real test environment. Since the parameters of DUTs at other test locations are not obtained for the time being, the DUTs disposed at other test locations in FIG. 5 are represented by dotted lines.

In the example shown in FIG. 5, a DUT0 is placed at the test location W1 on a test platform 20. At this moment, a signal source 10 can send a test signal to an input interface W0 of the test platform 20, and at the same time, the signal source 10 also sends the DUT0 separately a TCK signal which may be determined in advance as shown in FIG. 2. The connection relationship where the signal source 10 sends a TCK signal to the DUT0 disposed at the test location W1 is not shown in this figure. The DUT0 can receive the TCK signal and the test signal at the same time, that is, the test signal can be received according to the TCK signal, for example, a receiving action is triggered at the rising edge or falling edge of the TCK signal.

Furthermore, when the DUT0 receives the test signal, an important parameter is the TIS (TIS for short) at which the DUT0 receives the test signal, where, when the DUT receives the test signal under the trigger of the TCK signal, the test signal should reach the DUT before the trigger of the TCK signal, such that the test signal received is stable when the DUT is triggered by the TCK signal and begins to receive the test signal, which is equivalent to the operation of providing a certain time (hence the name "TIS") for the test signal to become stable in advance. If the time difference between the test signal and the TCK signal is less than the TIS, the test signal received by the DUT under the trigger of the TCK signal is not stable yet, which will cause the failure of the DUT to receive the test signal. Therefore, upon detection of time delay Tpd caused by impedance matching at the test location, the time delay Tpd can be quantified according to the TIS at which the DUT placed at the test location receives the test signal, and based thereupon, subsequent time offset is carried out.

In some embodiments, SHMOO testing can be conducted on DUTs disposed at each test location, thus acquiring time characteristic diagrams of the TIS at each test location. Each time characteristic diagram is uniformly distributed to indicate whether a DUT at a test location can accurately receive the test signal under the influence of impedance matching when receiving the test signal. Additionally, the time characteristic diagrams can be used as the time parameters acquired in S101.

Figure 6:
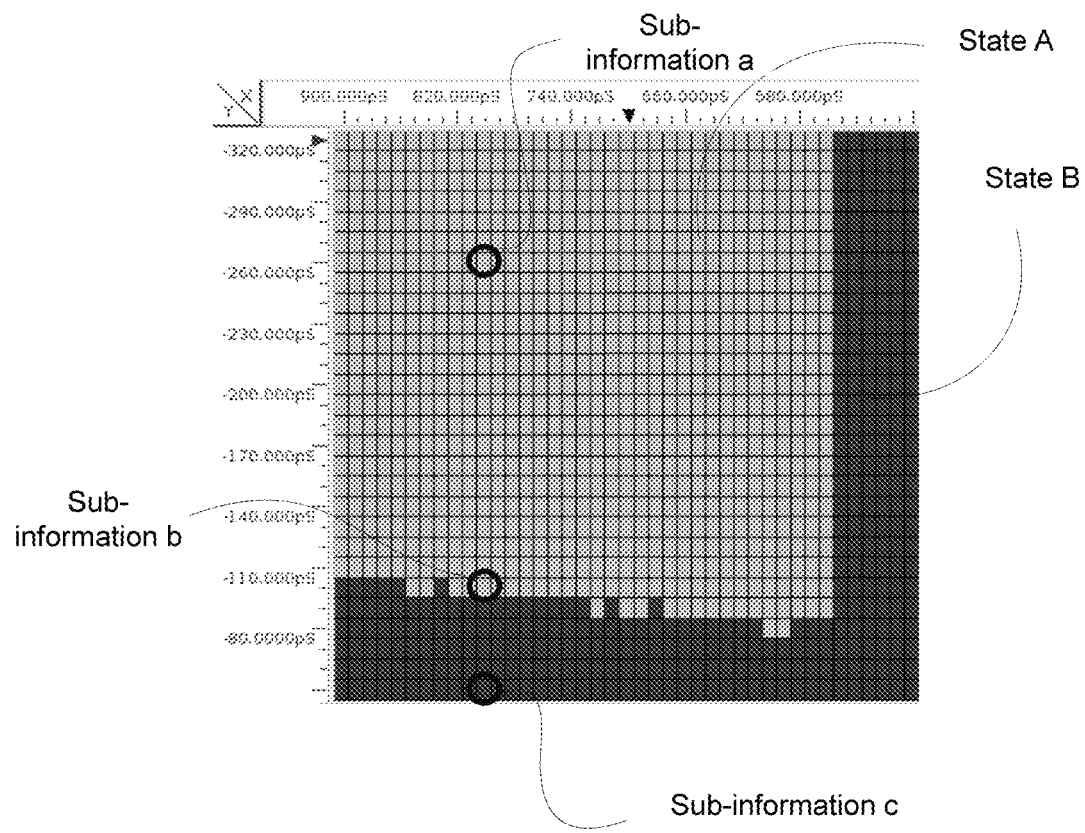
FIG. 6 is a schematic diagram of time parameters according to an embodiment of the present application.

Exemplarily, FIG. 6 is a schematic diagram of time parameters according to an embodiment of the present application, which is a state schematic diagram illustrating that the DUT0 disposed at the test location W1 in the scenario as shown in FIG. 5 receives test signals with different TCK cycles and TISs, respectively. The time parameters shown in FIG. 6 generally include a correspondence of the TCK signals with a plurality of frequencies, the TIS of a plurality of test signals and identification information, where the identification information can be understood as the color of each small box on a matrix composed of all the small boxes in FIG. 6.

More specifically, the time parameters include a plurality of sub-parameters that are distributed in the form of a matrix. With each small box in the figure representing a sub-parameter, all these sub-parameters forming time parameters featuring a plurality of rows and columns as a whole. The horizontal coordinate X of the matrix composed of a plurality of sub-parameters denotes the cycle of TCK signals, which changes according to a certain first preset rule, and the vertical coordinate Y denotes the TIS, which changes according to a certain second preset rule. Each sub-parameter can be understood as a three-dimensional array, including three parameters, namely, the frequency of the TCK signal, the TIS, and the state of sub-information. The state of each sub-information is indicative of whether the DUT can accurately receive a test signal with the TIS and the TCK signal. If yes, then the state in the sub-information is in the first state A (the lighter color of the small box in FIG. 6 indicates that the state of sub-information corresponding to the small box is in the first state A). If no, then the state in the sub-information is in the second state B (the darker color of the small box in FIG. 6 indicates that the state of sub-information corresponding to the small box is in the second state B).

Figure 7:
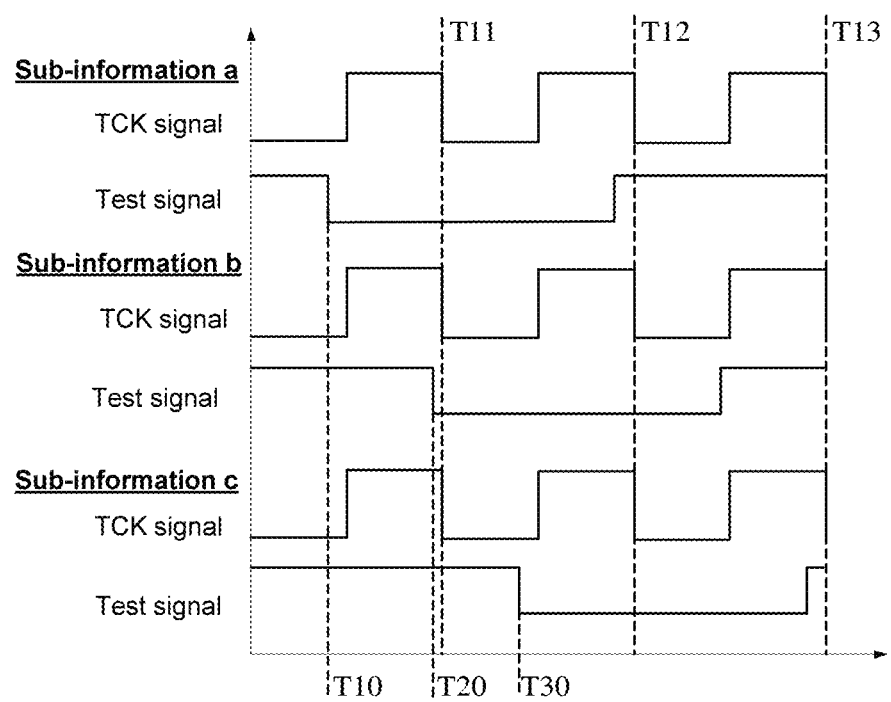
FIG. 7 is a schematic diagram illustrating the process of acquiring time parameters according to an embodiment of the present application.

The process of acquiring the time parameters as shown in FIG. 6 is described below with reference to FIG. 7. FIG. 7 is a schematic diagram illustrating the process of acquiring time parameters according to an embodiment of the present application, where in order to acquire the time parameters of the DUT0 disposed at the test location W1 in the scenario shown in FIG. 5, when the signal source 10 sends the test platform 20 test signals and TCK signals with one frequency, the offset device 30 sequentially adjusts TIS according to a second present rule, and controls the DUT0 to receive the test signal with a plurality of TIS and the current TCK signal, respectively. Finally, based on whether the DUT0 can successfully receive the test signal according to a TIS and a TCK signal, whether the identification information corresponding to the TIS and TCK is a first state A or a second state B is determined.

For example, as shown in FIG. 6, sub-information a, sub-information b and sub-information c corresponding to a TCK signal on the same x-coordinate are taken as examples. To obtain the sub-information a, when the signal source 10 sends the test signal and the TCK signal to the test platform 20, assuming that the TCK signal triggers the DUT0 at the test location W1 to receive the test signal at time T11, at the moment, the test signal has started being sent at time T10 before T11. Assuming that the minimum TIS required for the DUT0 to receive the test signal is T20, which is later than T10, when the DUT0 starts to receive the test signal at time T11 under the trigger of the TCK signal, the test signal has already reached a stable state. Therefore, in the sub-information a, the DUT0 can accurately receive the test signal according to the TCK signal, and thus the identification information of the sub-information corresponding to the TCK signal and TIS=(T10-T11) in FIG. 6 is denoted as the first state A.

Subsequently, in order to obtain the sub-information b, when the signal source 10 sends the test signal and the TCK signal to the test platform 20, assuming that the TIS is shortened to T20-T11, and the relative location relationship between the TCK signal and the test signal is obtained as shown in FIG. 7. In order to obtain this location relationship, the period of the test signal can be moved backward or the cycle of the TCK signals forward. These TCK signals and test signals should be understood as the same signals, arranged at different times on a regular basis. When the TCK signal triggers the DUT0 at the test location W1 to receive test signals at time T11, the test signal has already started being sent at time T20 before T11, such that when the DUT0 starts to receive the test signal at time T11 under the trigger of the TCK signal, the test signal has already reached a stable state. Therefore, the identification information of the sub-information b corresponding to the TCK signal and TIS=(T20-T11) in FIG. 6 is denoted as the first state A. Similarly, when the DUT0 receives the test signal at time T11 under the trigger of the TCK signal, the test signal just starts to be sent at T30 and do not have an enough time to reach a stable state, and therefore, regarding the sub-information c acquired in this process, the DUT0 cannot accurately receive the test signal based on the TCK signal. Therefore, the identification information of the sub-information c corresponding to the TCK signal and TIS=(T30-T10) in FIG. 6 is denoted as the second state B.

It is understandable that after the DUT0 at the test location W1 receives all the sub-information of the test signal in one column in FIG. 6 according to the TCK signal and at different TIS, the frequency of the TCK is then adjusted according to the first preset rule, the above process is repeated with the new TCK signal, and after all the sub-information in a plurality of columns in FIG. 6 is calculated, the time parameters generated when the DUT0 at the test location W1 receives the test signal throughout FIG. 6 are achieved.

Figure 8:
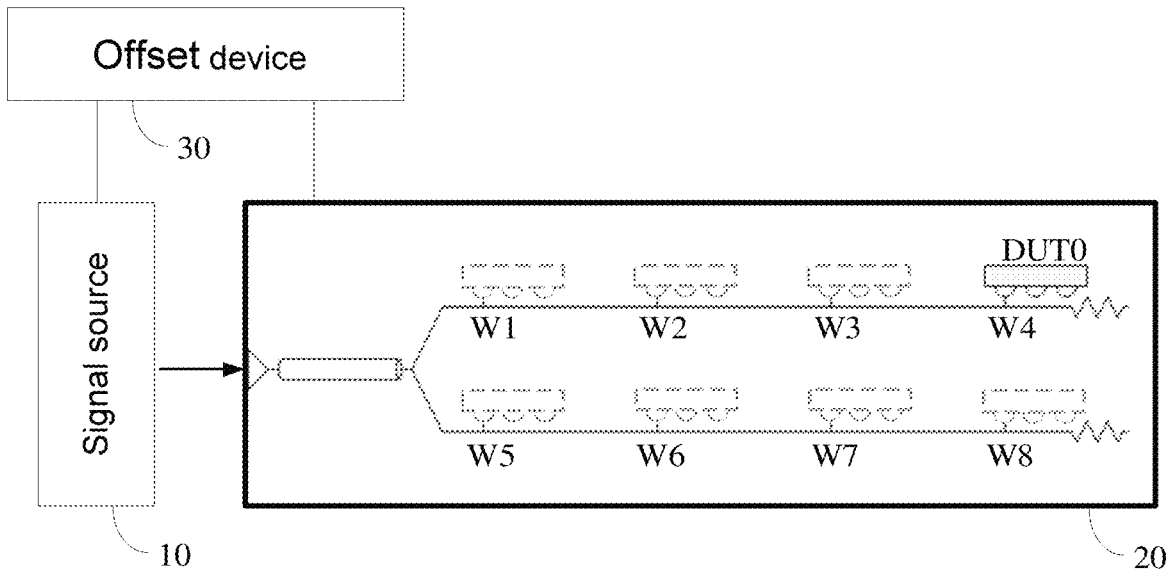
FIG. 8 is a schematic diagram illustrating another test state according to the present application.
Figure 9:
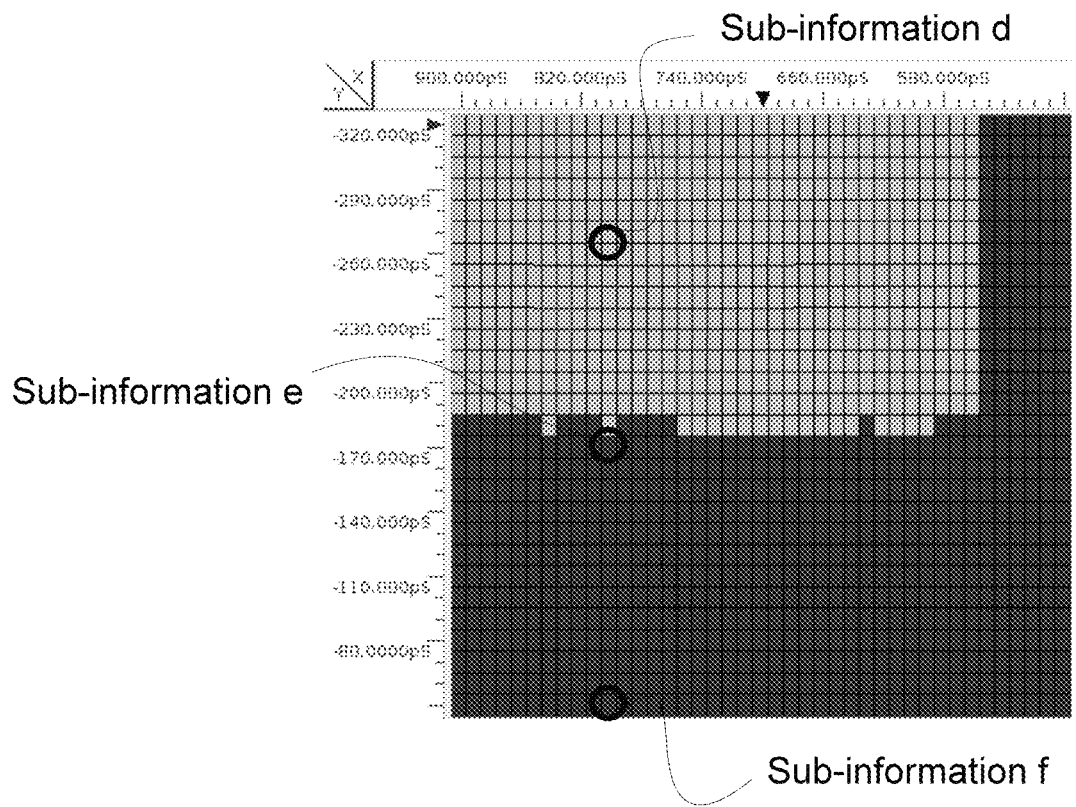
FIG. 9 is a schematic diagram of time parameters according to another embodiment of the present application.
Figure 10:
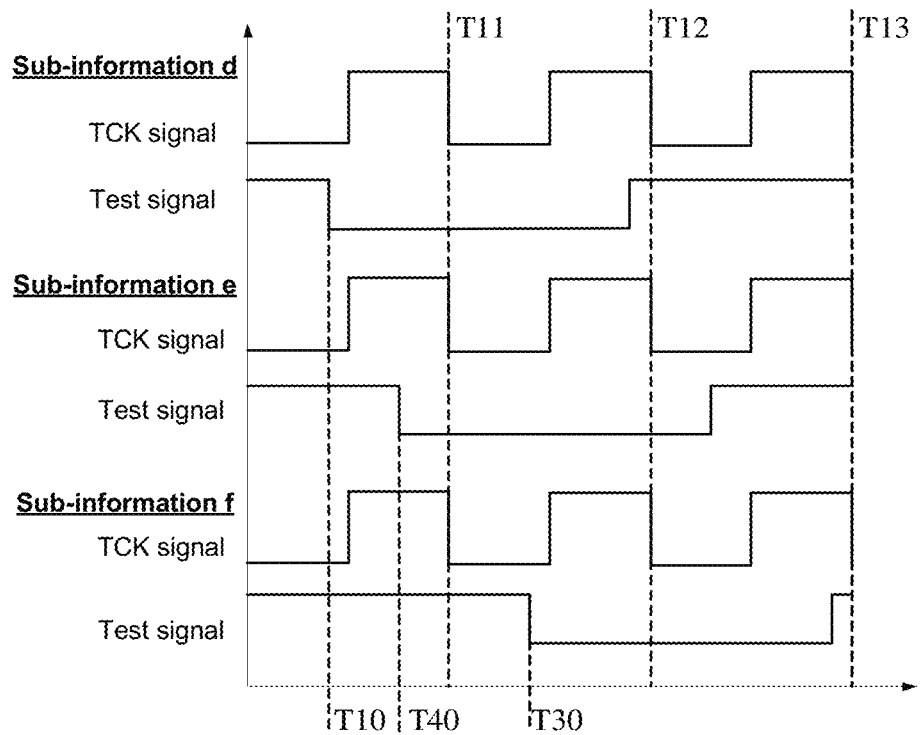
FIG. 10 is a schematic diagram illustrating the process of acquiring time parameters according to another embodiment of the present application.

The DUT0 is then moved from the test location W1 to another test location, and subject to SHMOO testing the same as that carried out at the W1 location, so as to obtain time parameters of the DUT at each test location at the time of receiving the test signal. For example, FIG. 8 is a schematic diagram illustrating another test state according to the present application. In this figure, a scenario where the DUT0 is disposed at the test location W4 of the test platform is shown. FIG. 9 is a schematic diagram of time parameters according to another embodiment of the present application, which, as shown in the scenario of FIG. 8, illustrates the state of the DUT0 disposed at the test location W4 when such DUT receives test signals with different TCK signals and at different TIS, respectively. The specific process of acquiring time parameters can refer to FIG. 10. FIG. 10 is a schematic diagram illustrating the process of acquiring time parameters according to another embodiment of the present application. See descriptions in FIGS. 5-7 for the detailed process of acquiring the time parameters of the DUT0 at the test location W4 shown in FIG. 9 in embodiments of FIGS. 8-10. Implementations and principles as described in FIGS. 8-10 are the same as those of FIGS. 5-7, which will not be repeated herein.

Figure 11:
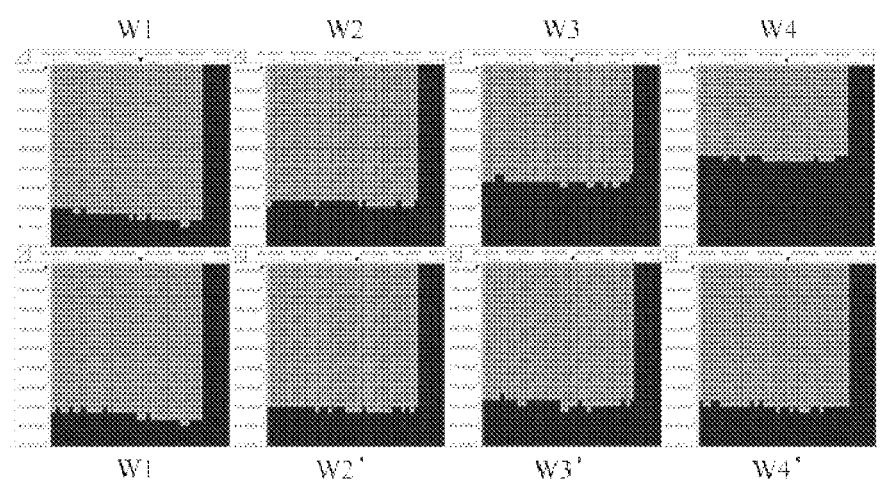
FIG. 11 is a schematic diagram of time parameters according to yet another embodiment of the present application.

Finally, the DUT0 is placed at each of test locations W1-W8 on the test platform 20 in turn, thus acquiring the time parameters at each test location. For example, FIG. 11 is a schematic diagram of time parameters according to yet another embodiment of the present application, which illustrates the time parameters of each DUT0 disposed at each of test locations W1-W8 locations obtained in S101. Given that time parameters are related to the distance from a test location to the signal source, the time parameters at W1-W4 and W5-W8 correspond one to one and are regarded as the same. For this reason, FIG. 11 only shows the time parameters at W1-W4 as an example.

S102: The offset device 30 determines the offset parameters corresponding to the test locations of the DUTs on the test platform 20 according to the target time parameters and the time parameters of each DUT.

When the time parameters at each test location are determined, the time parameters at other test locations can be offset according to target time parameters, where the target time parameters of the target DUT can be acquired in advance or can be preset. Given that the test locations W1 and W5 are closest to the signal source, impedance on the transmission path causes minimum or even negligible time delay on the test signal. Therefore, target time parameters can be time parameters, corresponding to the test locations W1 and W5 which are closest to the signal source, on the test platform 20. In this embodiment, the target time parameters are the time parameters of the DUT0 at the test location W1 as shown in FIG. 6 as an example, then the time parameters at the test locations W2-W4 and W6-W8 can be compared by reference to the target time parameter at the test location W1, thereby obtaining the corresponding offset parameters at each of test locations W2-W4 and W6-W8.

Specifically, for example, by adjusting the time parameters at the test location W4 shown in FIG. 9 with time parameters shown in FIG. 5 as the target parameters, then based on time parameters shown in FIG. 9, a plurality of critical TISs corresponding to TCK signals with each frequency, e.g., a plurality of critical TISs of the TCK signals with frequencies corresponding to sub-information d-f shown in FIG. 9 are taken as the TIS corresponding to the sub-information e. Assuming the period of the TCK signals is fixed, when the test signal is received at a TIS larger than the sub-information e, the sub-information above the sub-information e all corresponds to the first state, and when the test signal is received by a TIS smaller than the sub-information e, the sub-information below the sub-information e all corresponds to the second state. In the same way, a plurality of critical TIS corresponding to all the TCK signals in FIG. 9 can be obtained. Then, when the critical TIS corresponding to the same TCK signals in the target time parameters in FIG. 5 is subtracted from the critical TIS of all TCK signals in FIG. 9, the difference of the critical TIS corresponding to a plurality of TCK signals is obtained, which is the offset parameter corresponding to the time parameters at the test location W4.

Finally, the offset device 30 can, according to the same method described above, determine the offset parameters of the time parameters at each test location on the test platform 20. Then in S103, the offset device 30 sends the offset parameters determined in S102 to the signal source 10, such that time offset is carried out for each TCK signal according to the offset parameters when the signal source 10 subsequently sends the TCK signal to the DUT on the test platform 20, thus ensuring that the DUT for receiving the TCK signals can accurately receive the test signal.

For example, FIG. 12 is a schematic diagram illustrating offset for time parameters according to the present application. This figure gives a waveform schematic plot indicating that a DUT receives test signals when sub-information b corresponds to one TCK signal and a critical TIS=T20-T11 in the time parameters shown in FIG. 5. It also gives a waveform schematic plot indicating that corresponding DUT receives test signals when sub-information e corresponds to the same TCK signal and critical TIS=T40-T11 in the time parameters shown in FIG. 9. After difference is made between the critical TIS of the two time parameters in S102, it can be concluded that the offset parameter of the TCK signal in the time parameters in FIG. 9 is T40-T20. When the offset device 30 sends the offset parameter to the signal source 10, the signal source 40 can move forward the TCK signal sent to the DUT by time T40-T20 when sending the test signal subsequently to the DUT at the test location W4. At this time, the waveform received by the DUT is shown in the sub-information e' of FIG. 12, and the interval between the T40 and trigger time T11' is greater than the minimum TIS, such that the identification information corresponding to the sub-information e is switched from the second state B to the first state A of the identification information corresponding to the sub-information e'.

According to the same method mentioned above, after time parameters calculated at the test locations W2-W4 are offset, respectively, W2'-W4' at which offset time parameters are shown in FIG. 11 can be obtained. It is observed that in the modified time parameters, the number of sub-information corresponding to the first state is increased. The time parameters at test locations W6-W8 have the same state as that of test parameters at W2-W4 before and after modification, which will not be repeated herein.

In some embodiments, the offset for time parameters may be specifically implemented by modifying the time parameter LINE1 in the configuration file TPD OFFSET as shown in FIG. 13. For example, FIG. 13 is a schematic diagram illustrating a time offset method according to the present application. The time offset method includes modifying the time parameter 362 of the TCK signal output by a pin F802 of a DUT2 disposed at the test location W2 to time parameter 392, modifying the time parameter 724 of the TCK signal output by a pin F803 of the DUT3 disposed at the test location W3 to time parameter 784, and modifying the time parameter 1086 of the TCK signal output by a pin F804 of a DUT4 disposed at the test location W4 to time parameter 1176, and so on. It should be noted that the file shown in FIG. 13 is only exemplary, which is intended to illustrate an implementation of time offset of the present application, rather than to define a time offset method, parameters or numerical values.

Therefore, according to the time offset method for a test signal provided in embodiments of the present application, when a signal source sends test signals to a DUT on a test platform, the offset device can determine the time delay brought to the DUT at the upper side of each test location by impedance matching of test signals at each test location, and conduct time offset for TCK signals sent by the signal source to different DUTs according to the time delay, thus resolving the technical problem of time delay brought to the test signal by the impedance matching. In this way, the DUT can receive the test signal more accurately, which in turn improves the accuracy of the test platform for testing a device such as a DUT.

In some embodiments, the time parameters corresponding to each test location can be offset as described above, while in other embodiments, test locations where offset is needed on the test platform can be identified first, and then time parameters at the identified part of the test locations are offset, which contributes to reduced amount of invalid calculation and improved efficiency. For example, a standard DUT can be separately placed at a plurality of test locations on a test platform, and when a signal source sends a test signal and a TCK signal to the standard DUT respectively, whether the standard DUT can accurately receive the test signal according to the preset TIS and the received TCK signal at each test location is determined. Afterwards, test locations of a plurality of test locations at which the standard DUT cannot accurately receive any test signal are taken as locations for offset, and then TCK signals generated at such location are subject to time offset. For test positions of a plurality of test locations at which the standard DUT can accurately receive the test signal, no time offset is performed.

In some embodiments of the present application, in order to acquire corresponding time parameters at different test locations, a same DUT is placed at different test locations. In other embodiments, when it is ensured that the impedance of all DUTs is the same or approximately equivalent, then different DUTs can be used and disposed at different test locations on the test platform, so as to acquire the time parameters of a plurality of DUTs at each test location at the same time.

The aforementioned embodiments introduce the time offset method for a test signal provided by embodiments of the present application. In order to realize the functions in the method provided by embodiments of the present application, the offset device as an implementation body may include a hardware structure and/or software module to realize the above functions in the form of the hardware structure, the software module, or the hardware structure in combination with the software module. One of the above functions is carried out in the form of a hardware structure, a software module, or a hardware structure in combination with a software module, based on particular applications and design constraint conditions of the technical solutions.

For example, FIG. 14 is a schematic structural diagram of an offset device for test signals according to an embodiment of the present application, which illustrates a possible implementation of the offset device 30, the offset device 30 including an acquisition module 301, a processing module 302 and an offset module 303.

Specifically, an acquisition module 301 is configured to acquire time parameters of each of DUTs when a signal source sends a test signal to the DUTs at a plurality of test locations on a test platform, where impedance on a transmission path between the signal source and each of the test locations differs from one another, and the time parameters are used for indicating whether the impedance on each transmission path has an impact on receiving the test signal by the DUT; a processing module 302 is configured to determine, based on target time parameters and the time parameter of each of the DUTs, offset parameters corresponding to the plurality of test locations where the DUTs are located; and an offset module 303 is configured to send the signal source the plurality of offset parameters corresponding to the plurality of test locations such that the signal source performs, according to the plurality of offset parameters, time offset for TCK signals sent to the plurality of test locations.

In some embodiments, target time parameters are used for indicating whether impedance on a transmission path from a signal source to a target test location has an impact on receiving test signals by a target DUT disposed at the target test location; where the target test location is the test location closest to the signal source on a test platform.

In some embodiments, time parameters include a correspondence of TCK signals with a plurality of frequencies, a plurality of TISs of the test signal and identification information; where the identification information is used for indicating whether DUTs, when receiving test signals at the plurality of TISs respectively, can accurately receive the test signal according TCK signals with the plurality of frequencies, respectively.

In some embodiments, TCK signals with a plurality of frequencies change according to a first preset rule; and a plurality of TISs change according to a second preset rule.

In some embodiments, identification information includes a plurality of pieces of sub-information, each of which being indicative of whether DUTs can accurately receive the test signal when receiving a TCK signal with one of the plurality of frequencies at one of the plurality of TISs; the sub-information in a first state indicates that the DUTs can accurately receive the test signal at one TIS, according to the TCK signal with one frequency; and the sub-information in a second state indicates that the DUTs cannot accurately receive the test signal at one TIS, according to the TCK signal with one frequency.

In some embodiments, the acquisition module 301, when determining the time parameters of a first DUT of the DUTs, is specifically configured to: determine that a signal source sends the test signal and a first TCK signal of the TCK signals with a plurality of frequencies to the first DUT; based on a second preset rule, sequentially set a TIS of the first DUT to the plurality of TISs; control the first DUT to receive the test signal with the first TCK signal at a first TIS of the plurality of TISs; and determine, based on whether the first DUT successfully receives the test signal, identification information, corresponding to the first TIS and the first TCK signal, in the first time parameters.

In some embodiments, a processing module 302, when determining first offset parameters of a first DUT of a plurality of DUTs, is specifically configured to: determine in first time parameters a plurality of critical TISs corresponding to each TCK signal with the corresponding frequency; where when the first DUT receives the test signal with the TCK signal with one frequency, sub-information corresponding to a TIS greater than a critical TIS is in the first state, and sub-information corresponding to a TIS less than the critical TIS is in the second state; and obtain first offset parameters based on the difference between a plurality of critical TISs corresponding to each TCK signal with the corresponding frequency in the target time parameters and the plurality of critical TISs of each TCK signal with the corresponding frequency in first time parameters.

In some embodiments, an acquisition module 301 is further configured to acquire target time parameters of a target DUT on a test platform.

In some embodiments, an acquisition module 301 is further configured to send, via the signal source, the test signal and TCK signals to standard DUTs when the standard DUTs are located at the plurality of test locations on test platform; and control the standard DUT at each test location to receive the test signal with the TCK signal at a preset TIS; and a processing module 302 is further configured to determine, from the plurality of test locations, a test location at which the standard DUT cannot accurately receive the test signal as a location to be offset, and conduct time for the TCK signal at the location to be offset.

It should be noted that it is understandable that the modules of the foregoing device are divided merely in terms of logical functions, which, in actual implementation, can not only be integrated on a physical entity in whole or in part, but also be divided in a physical level. These modules can be implemented in the form of software called through processing components in whole or part, or in the form of hardware in whole or part. A module can be implemented by an independent processing element, or a chip integrated on the foregoing device. In addition, it can also be stored in a memory of the foregoing device in the form of program codes. One of the processing elements of the foregoing device calls and executes the functions of the above determining module. Other modules are implemented in a similar way. In addition, these modules can be integrated in whole or in part, or implemented independently. The processing element described herein may be an integrated circuit capable of processing signals. During the implementation, each step of the foregoing method or each of the foregoing modules may be performed through an integrated logic circuit as hardware in a processor element or through instructions as software.

For example, the foregoing modules may be one or more integrated circuits configured to implement the above method, such as one or more application specific integrated circuits (ASIC), or one or more digital signal processors (DSP), or one or more field programmable gate arrays (FPGA), etc. For another example, when one of the above modules is implemented in the form of calling a program code using a processing element, the processing element may be an all-purpose processor, such as a central processing unit (CPU) or other processor that can call the program code. For another example, these modules can be integrated and implemented in the form of a system-on-chip (SOC).

The foregoing embodiments may be implemented in whole or in part by software, hardware, firmware, or any combination thereof. When software is used for implementation, the implementation can be performed in a form of a computer program product in whole or in part. The computer program product includes one or more computer instructions. When the computer program instructions are loaded and executed on a computer, the procedures or functions according to the embodiments of the present application are achieved in whole or in part. The computer may be a general-purpose computer, a dedicated computer, a computer network, or another programmable device. The computer instructions may be stored in a computer-readable storage medium or may be sent from a computer-readable storage medium to another computer-readable storage medium. For example, the computer instructions may be sent from a website, computer, server, or data center to another website, computer, server, or data center in a wired (for example, a coaxial cable, an optical fiber, or a Digital Subscriber Line (DSL)) or wireless (for example, infrared, radio, and microwave) manner. The computer-readable storage medium may be any usable medium accessible by a computer, or a data storage device, such as a server or a data center, integrating one or more usable media. The usable medium may be a magnetic medium (such as a floppy disk, a hard disk, or a magnetic tape), an optical medium (such as a DVD), a semiconductor medium (such as a solid state disk (SSD)), or the like.

Figure 15:
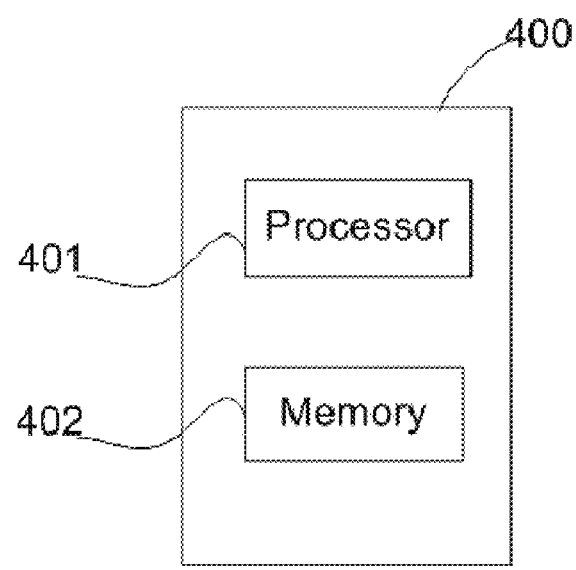
FIG. 15 is a block diagram of an offset device for test signals according to an embodiment of the present application.

An embodiment of the present disclosure provides a time offset device for a test signal. Referring to FIG. 15, the apparatus for testing semiconductor devices 400 may be provided as a terminal device. The time offset device 400 for a test signal may include a processor 401, and one or more processors may be set as required. The time offset device 400 for a test signal may further include a memory 402 configured to store an executable instruction, such as an application program, of the processor 401. One or more memories may be set as required. The memory may store one or more application programs. The processor 401 is configured to execute the instruction to perform the foregoing method. In an embodiment, a non-transitory computer-readable storage medium including instructions is provided. Referring to FIG. 15, for example, the non-transitory computer-readable storage medium may be the memory 402 including instructions. The foregoing instructions may be executed by the processor 401 of the time offset device 400 to complete the foregoing method. For example, the non-transitory computer-readable storage medium may be a ROM, a RAM, a CD-ROM, a magnetic tape, a floppy disk, an optical data storage device, or the like. Embodiments of the present application also provide a chip for running instructions, which is configured to execute a time offset method for a test signal implemented by the offset device according to any one of foregoing embodiments of the present application.

Embodiments of the present application also provide a program product including a computer program stored in a storage medium, and at least one processor can read the computer program from the storage medium. The at least one processor, when executing the computer program, can achieve a time offset method for a test signal executed by an electronic device according to any one of foregoing embodiments of the present application.

Those of ordinary skill in the art can understand that all or some of the steps in the foregoing method embodiments may be implemented by a program instructing relevant hardware. The program may be stored in a computer readable storage medium. When the program runs, the steps of the method embodiments are performed. The foregoing storage medium includes: any medium that can store program code, such as a ROM, a RAM, a magnetic disk, or an optical disc.

Finally, it should be noted that the above embodiments are merely used to explain the technical solutions of the present application, but are not intended to limit the present application. Although the present application is described in detail with reference to the foregoing embodiments, those of ordinary skill in the art should understand that they can still modify the technical solutions described in the foregoing embodiments, or make equivalent substitutions on some or all technical features therein. These modifications or substitutions do not make the essence of the corresponding technical solutions deviate from the spirit and scope of the technical solutions of the embodiments of the present application.

The invention claimed is:

1. A time offset method for a test signal, wherein the time offset method comprises:
   acquiring time parameters of each of devices under test (DUTs) when a signal source sends a test signal to the DUTs at a plurality of test locations on a test platform, wherein impedance on a transmission path between the signal source and each of the test locations differs from one another, and the time parameters are used for indicating whether the impedance on each transmission path has an impact on receiving the test signal by the DUT;
   determining, based on target time parameters and the time parameters of each of the DUTs, offset parameters corresponding to the plurality of test locations where the DUTs are located; and
   sending the signal source the plurality of offset parameters corresponding to the plurality of test locations such that the signal source performs, according to the plurality of offset parameters, time offset for test clock (TCK) signals sent to the plurality of test locations.

2. The method according to claim 1, wherein
   the target time parameters are used for indicating whether impedance on a transmission path from the signal source to a target test location has an impact on receiving the test signal by a target DUT disposed at the target test location; wherein the target test location is a test location closest to the signal source on the test platform.

3. The method according to claim 2, wherein
   the time parameters comprise a correspondence of TCK signals with a plurality of frequencies, a plurality of setup times (TISs) of the test signal and identification information;
   wherein the identification information is used for indicating whether the DUTs, when receiving the test signal at the plurality of TISs, can accurately receive the test signal according to the TCK signals with the plurality of frequencies, respectively.

4. The method according to claim 3, wherein
the TCK signals with the plurality of frequencies change according to a first preset rule; and
the plurality of TISs change according to a second preset rule.

5. The method according to claim 4, wherein
the identification information comprises a plurality of pieces of sub-information, each of the plurality of pieces of sub-information being indicative of whether the DUTs can accurately receive the test signal at one of the plurality of TISs, according to the TCK signal with one of the plurality of frequencies;
the sub-information in a first state indicates that the DUTs can accurately receive the test signal at one TIS, according to the TCK signal with one frequency; and
the sub-information in a second state indicates that the DUTs cannot accurately receive the test signal at one TIS, according to the TCK signal with one frequency.

6. The method according to claim 5, wherein during acquiring the time parameters of each of DUTs, first time parameters of a first DUT in a plurality of DUTs are acquired comprises:
determining that the signal source sends the test signal and a first TCK signal of the TCK signals with the plurality of frequencies to the first DUT;
according to the second preset rule, sequentially setting a TIS of the first DUT to the plurality of TISs;
controlling the first DUT to receive the test signal with the first TCK signal at a first TIS of the plurality of TISs; and
determining, based on whether the first DUT successfully receives the test signal, identification information, corresponding to the first TIS and the first TCK signal, in the first time parameters.

7. The method according to claim 6, wherein determining first offset parameters corresponding to a first test location where the first DUT in the plurality of DUTs is located according to the target time parameters and the first time parameters of the first DUT comprises:
determining in the first time parameters a plurality of critical TISs corresponding to each TCK signal with corresponding frequency; wherein when the first DUT receives the test signal with the TCK signal with one frequency, the sub-information corresponding to the TIS greater than the critical TIS is in the first state, and the sub-information corresponding to the TIS less than the critical TIS is in the second state; and
obtaining the first offset parameters based on a difference between the plurality of critical TISs corresponding to each TCK signal with the corresponding frequency in the target time parameters and the plurality of critical TISs of each TCK signal with the corresponding frequency in the first time parameters.

8. The method according to claim 7, wherein the method further comprises:
acquiring target time parameters of the target DUT on the test platform.

9. The method according to claim 8, wherein the method further comprises:
sending, by the signal source, the test signal and the TCK signals to standard DUTs when the standard DUTs are located at the plurality of test locations on the test platform;
controlling the standard DUT at each test location to receive the test signal with the TCK signal at a preset TIS; and
determining, in the plurality of test locations, a test location at which the standard DUT cannot accurately receive the test signal as a location to be offset, and conducting time offset for the TCK signal at the location to be offset.

10. A time offset device for a test signal, wherein the time offset device comprises:
one or more processors; and
a storage apparatus, configured to store one or more programs, wherein the one or more programs, when executed by the one or more processors, cause the one or more processors to execute operations of:
acquiring time parameters of each of devices under test (DUTs) when a signal source sends a test signal to the DUTs at a plurality of test locations on a test platform, wherein impedance on a transmission path between the signal source and each of the test locations differs from one another, and the time parameters are used for indicating whether the impedance on each transmission path has an impact on receiving the test signal by the DUT;
determining, based on target time parameters and the time parameters of each of the DUTs, offset parameters corresponding to the plurality of test locations where the DUTs are located; and
sending the signal source the plurality of offset parameters corresponding to the plurality of test locations such that the signal source performs, according to the plurality of offset parameters, time offset for test clock (TCK) signals sent to the plurality of test locations.

11. The device according to claim 10, wherein
the target time parameters are used for indicating whether impedance on a transmission path from the signal source to a target test location has an impact on receiving the test signal by a target DUT disposed at the target test location; wherein the target test location is a test location closest to the signal source on the test platform.

12. The device according to claim 11, wherein
the time parameters comprise a correspondence of TCK signals with a plurality of frequencies, a plurality of setup times (TISs) of the test signal and identification information; wherein the identification information is used for indicating whether the DUTs, when receiving the test signal at the plurality of TISs, can accurately receive the test signal according to the TCK signals with the plurality of frequencies, respectively.

13. The device according to claim 12, wherein
the TCK signals with the plurality of frequencies change according to a first preset rule; and
the plurality of TISs change according to a second preset rule.

14. The device according to claim 13, wherein
the identification information comprises a plurality of pieces of sub-information, each of the plurality of pieces of sub-information being indicative of whether the DUTs can accurately receive the test signal when receiving the TCK signal with one of the plurality of frequencies at one of the plurality of TISs;
the sub-information in a first state indicates that the DUTs can accurately receive the test signal at one TIS, according to the TCK signal with one frequency; and the sub-information in a second state indicates that the DUTs cannot accurately receive the test signal at one TIS, according to the TCK signal with one frequency.

15. The device according to claim 14, wherein when determining time parameters of a first DUT in a plurality of DUTs, the one or more programs cause the one or more processors to execute operations of: determining that the signal source sends the test signal and a first TCK signal of the TCK signals with the plurality of frequencies to the first DUT;

according to the second preset rule, sequentially setting a TIS of the first DUT to the plurality of TISs;

controlling the first DUT to receive the test signal with the first TCK signal at a first TIS of the plurality of TISs; and determining, based on whether the first DUT successfully receives the test signal, identification information, corresponding to the first TIS and the first TCK signal, in first time parameters.

16. The device according to claim 15, wherein when determining first offset parameters of the first DUT in the plurality of DUTs, the one or more programs cause the one or more processors to execute operations of:

determining in the first time parameters a plurality of critical TISs corresponding to each TCK signal with corresponding frequency; wherein when the first DUT receives the test signal with the TCK signal with one frequency, the sub-information corresponding to the TIS greater than the critical TIS is in the first state, and the sub-information corresponding to the TIS less than the critical TIS is in the second state; and obtaining the first offset parameters based on a difference between the plurality of critical TISs corresponding to each TCK signal with the corresponding frequency in the target time parameters and the plurality of critical TISs of each TCK signal with the corresponding frequency in the first time parameters.

17. The device according to claim 16, wherein the one or more programs cause the one or more processors to execute operations of:

determining the target time parameters of the target DUT on the test platform.

18. The device according to claim 17, wherein the one or more programs cause the one or more processors to execute operations of:

sending, by the signal source, the test signal and the TCK signals to standard DUTs when the standard DUTs are located at the plurality of test locations on the test platform; and controlling the standard DUT at each test location to receive the test signal with the TCK signal at a preset TIS; and determining, in the plurality of test locations, a test location at which the standard DUT cannot accurately receive the test signal as a location to be offset, and conducting time offset for the TCK signal at the location to be offset.

* * * * *